(12) United States Patent
Boeve et al.

(10) Patent No.: US 8,503,226 B2
(45) Date of Patent: *Aug. 6, 2013

(54) PROGRAMMABLE PHASE-CHANGE MEMORY AND METHOD THEREFOR

(75) Inventors: Hans Boeve, Hechtel-Eksel (BE); Niek Lambert, Waalre (NL); Victor Van Acht, Waalre (NL); Karen Attenborough, Hechtel-Eksel (BE)

(73) Assignee: NXP B.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 13/481,030

(22) Filed: May 25, 2012

(65) Prior Publication Data

US 2012/0230100 A1 Sep. 13, 2012

Related U.S. Application Data

(62) Division of application No. 11/721,432, filed as application No. PCT/IB2005/054167 on Dec. 9, 2005, now Pat. No. 8,208,293.

(60) Provisional application No. 60/593,129, filed on Dec. 13, 2004.

(51) Int. Cl.
*G11C 11/00* (2006.01)

(52) U.S. Cl.
USPC ............................................ 365/163; 365/148

(58) Field of Classification Search
USPC .................................................. 365/148, 163
See application file for complete search history.

(56) References Cited

U.S. PATENT DOCUMENTS

| 5,166,758 | A | 11/1992 | Ovshinsky et al. |
| 6,172,902 | B1 | 1/2001 | Wegrowe et al. |
| 6,850,432 | B2 * | 2/2005 | Lu et al. ................ 365/163 |
| 8,208,293 | B2 * | 6/2012 | Boeve et al. ............ 365/163 |
| 2003/0235073 | A1 | 12/2003 | Fricke et al. |
| 2004/0203183 | A1 | 10/2004 | Cho |
| 2004/0245554 | A1 | 12/2004 | Oh et al. |
| 2005/0111247 | A1 | 5/2005 | Takaura et al. |

FOREIGN PATENT DOCUMENTS

| EP | 0269225 A2 | 6/1988 |
| JP | 2004349504 A | 12/2004 |
| WO | 03073512 A1 | 9/2003 |

* cited by examiner

*Primary Examiner* — Hoai V Ho

(57) ABSTRACT

A non-volatile memory is disclosed. A contiguous layer of phase change material is provided. Proximate the contiguous layer of phase change material is provided a first pair of contacts for providing an electrical current therebetween, the electrical current for passing through the contiguous layer of phase change material for inducing heating thereof within a first region. Also adjacent the contiguous layer is provided a second pair of contacts disposed for providing an electrical current therebetween, the electrical current for passing through the contiguous layer of phase change material for inducing heating thereof within a second region thereof, the second region different from the first region.

7 Claims, 9 Drawing Sheets

PROGRAMMABLE PHASE-CHANGE MEMORY AND METHOD THEREFOR

This patent document is a divisional under 35 U.S.C. §120 of U.S. patent application Ser. No. 11/721,432 filed on Sep. 29, 2009 now U.S. Pat. No. 8,208,293, which is a 35 U.S.C. §371 national stage entry of International Application No. PCT/IB2005/054167 filed on Dec. 9, 2005 which claims priority benefit under 35 U.S.C. §119 of U.S. Provisional Application No. 60/593,129 filed on Dec. 13, 2004, to which priority is also claimed here.

The present invention relates to non-volatile memories, and more particularly to non-volatile memories wherein data is recorded or erasable by heating and cooling of phase change cells therein.

Already known as non-volatile memories are flash memories, FeRAMs, MRAMs, and phase-change memories. U.S. Pat. No. 6,172,902, for example, discloses an MRAM incorporated in a membrane, and U.S. Pat. No. 5,166,758 discloses the construction of a phase-change memory.

Recently, attention has been directed to phase-change non-volatile memories due to their apparent stability. Two phase-change memory cell integration concepts are currently discussed in the prior art literature. A first phase-change memory cell integration concept relies on a perpendicular device that resembles a variable contact resistance due to local heating applied therein.

Unfortunately, the above method has limitations, for example, in reliability and manufacture. It would be advantageous to provide a straightforward structure for providing current constriction that is manufacturable with current integrated circuit manufacturing equipment. Each prior art device relies on a phase change cell having known dimensions and requiring patterning or several step manufacturing processes to be formed. In order to miniaturise these structures, a smaller phase change cell is required, thereby requiring more precise manufacturing processes.

It is an object of the present invention to provide an architecture for supporting non-patterned one time programmable non-volatile memory based on a phase change material.

In accordance with the invention there is provided a non-volatile memory comprising: a contiguous layer of phase change material having therein a first region for encoding of first data therein and a second other region for encoding of second different data therein; a first pair of contacts disposed for providing an electrical current therebetween, the electrical current for passing through the contiguous layer of phase change material for inducing heating thereof within the first region; and, a second pair of contacts disposed for providing an electrical current therebetween, the electrical current for passing through the contiguous layer of phase change material for inducing heating thereof within the second other region thereof.

In accordance with another aspect of the invention there is provided a method of forming a memory device comprising: providing an amorphous phase change layer; and, providing electrical contacts spaced apart one from another, a pair of the electrical contacts for, when conducting, resulting in localized heating within the amorphous phase change layer to result in a region of crystalline phase change layer material within the amorphous phase change layer and electrically conducting between the pair of the electrical contacts.

In accordance with another aspect of the invention there is provided a memory having data stored therein, the data for when executed resulting in a non-volatile memory comprising: a contiguous layer of phase change material having therein a first region for encoding of first data therein and a second other region for encoding of second different data therein; a first pair of contacts disposed for providing an electrical current therebetween, the electrical current for passing through the contiguous layer of phase change material for inducing heating thereof within the first region; and, a second pair of contacts disposed for providing an electrical current therebetween, the electrical current for passing through the contiguous layer of phase change material for inducing heating thereof within the second other region thereof.

Exemplary embodiments of the invention will now be described in conjunction with the following drawings, in which.

Figure 1:
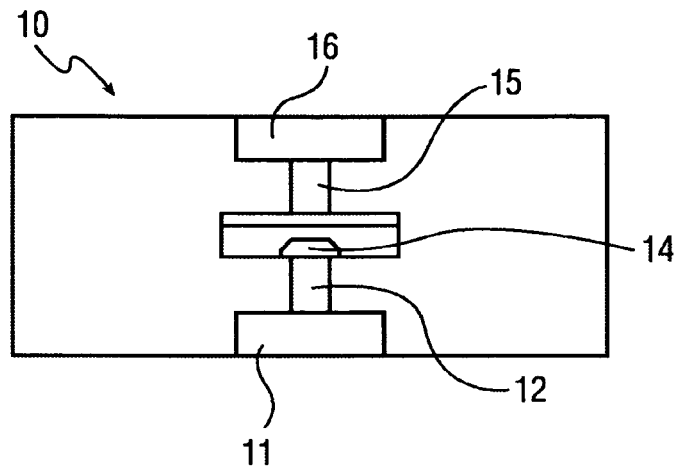
FIG. 1 is a cross sectional side view showing a prior art non-volatile memory.

Referring to FIG. 1, a typical prior art phase change cell 10 is shown. Here, a first electrode 11 is shown. A first conductor 12 in the form of a via is disposed in electrical contact with the electrode 11. Adjacent the first conductor 12 is a cell comprising a programmable volume of phase change material 14. A second conductor 15 in the form of a via is disposed on an opposing side of the cell 14. In electrical contact with the conductor 15 is a second electrode 16.

During operation, a current is applied to the first electrode 11. The current is confined within the first conductor 12 resulting in heating of the phase change material within the a programmable volume 14. With slow cooling, the phase change material enters a crystalline state. With more rapid cooling, the phase change material enters an amorphous state. In its amorphous state, the phase change material has a different resistance from in its crystalline state, and as such, the state of a cell is determinable based on the resistance of the programmable volume of phase change material therein.

Prior art phase change based memory structures relies on a patterned phase change material confined within predetermined cell boundaries. In prior art implementations, the different memory cells are galvanically separated. Hence the mask layout for the phase change layer is such that every bit of the memory array is an isolated island on the mask. According to the present invention, a phase change memory is disclosed wherein material properties in a phase-change film that is in principle unpatterned are changed locally by providing a local heat profile resulting from a particular current flow within the layer. Unpatterned as used herein refers to a shape and size of a phase-change film that is other than directly correlated to a single individual memory cells. Advantageously, the unpatterned phase change film is a larger entity surface than that required for a single phase change memory cell and, further advantageously, the phase change film comprises a large unpatterned surface area, for example a complete unpatterned film.

As described herein below, the invention is particularly suitable to one-time programmable phase-change read-only memory devices. The programming operation results in the creation of low-resistive, or crystalline, areas or channels in a sea of highly resistive amorphous material. The presented route to manufacturing one-time programmable memory arrays can be applied in various applications, such as ROM code storage for consumer electronics products, or even for content distribution. Mainly the applications where typically mask-ROM is used are targeted.

Figure 2:
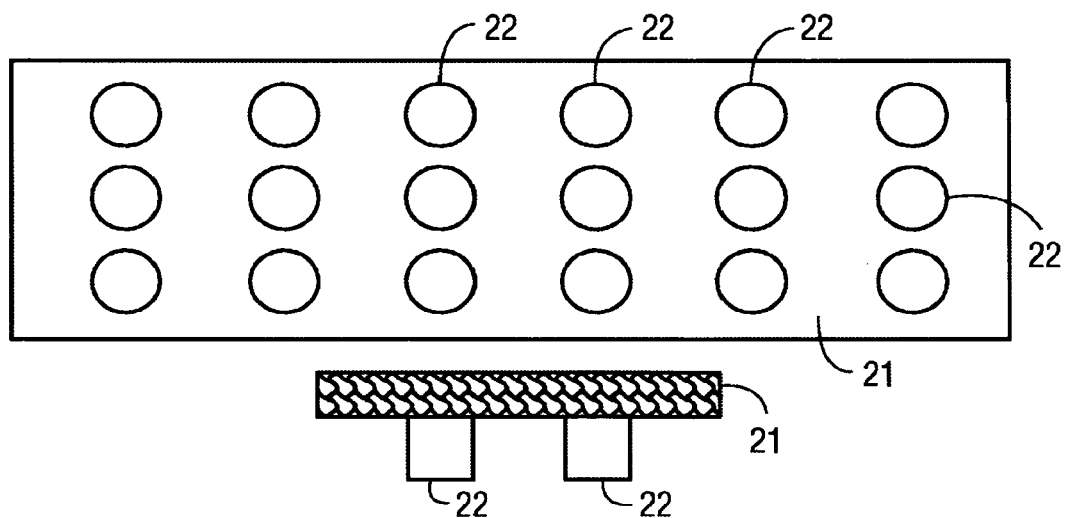
FIG. 2 is a simplified top view and a simplified cross sectional partial side view of a contiguous unpatterned phase-change layer and a plurality of spaced apart contacts.
Figure 3:
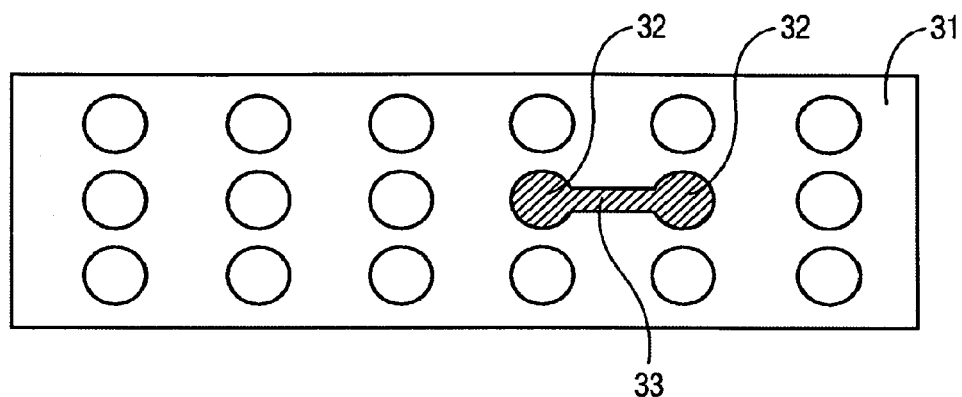
FIG. 3 is a simplified top view showing a low resistive bridge between two of the spaced apart contacts.

Referring to FIG. 2, a contiguous unpatterned phase-change layer 21 is disposed on a plurality of spaced apart contacts 22. Any pair of the spaced apart contacts 22 serves as connection nodes for driving current and/or voltage through the contiguous phase change layer 21. Referring to FIG. 3, two spaced apart contacts 32 act as contacts for forming a current flow path 33 within the contiguous unpatterned phase-change layer 31. As a result of local heating created in the specific current flow path resulting from application of current between a pair of spaced apart contacts 32 and the current flowing within the contiguous unpatterned phase-change layer 31, the temperature in the phase-change material within and immediately adjacent the current flow path 33 starts to increase slightly. This temperature rise is accelerated because the local current path becomes more localized with increased temperature, even at lower temperatures, i.e. below the crystallization temperature Tc. Once the crystallization temperature is reached locally, a low-resistive path is present between the two spaced apart electrodes.

Figure 4:
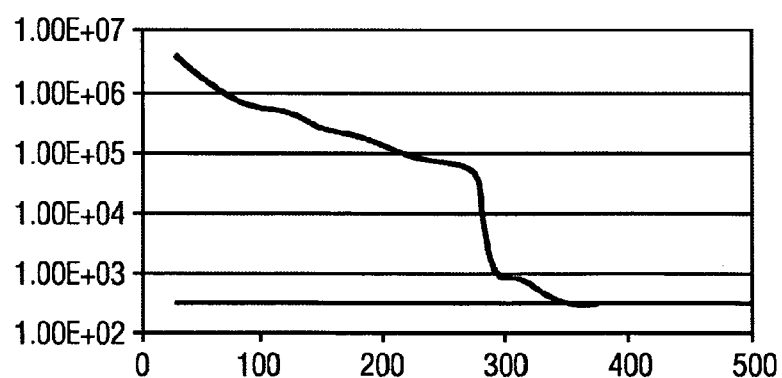
FIG. 4 shows a graphical representation of an exemplary resistivity versus temperature plot for a phase-change material.

FIG. 4 shows a graphical representation of a typical resistivity versus temperature plot for an exemplary phase-change material. The transition temperature Tc of the material is shown about 275 deg C. For different classes of materials, the transition temperature varies from 100 to 300 deg C., or possibly even higher. The sudden drop in resistivity at the crystallization temperature reflects the change in phase within the material. Also noticeable is the continuous decrease in resistivity as a function of temperature before crystallization occurs. This result is highly advantageous for device operation as described hereinabove.

According to the present embodiment, local heating of the material within the contiguous unpatterned phase change layer 31 is achieved with a driven voltage in combination with a particular current compliance. Gradually, the current profile becomes more pronounced due to variation in resistance within the phase change layer 31. At the phase-transition, current is capped to block the accelerating effect of a sudden drop in resistance. Temperatures in the order of 200 to 300 deg C. and higher are achievable for a phase-change layer with thickness in the range of 20 to 50 nm with an applied voltage in the order of 3 to 5 Volts. The required write time decreases for a higher applied voltage bias ($P=V^2/R$). The separation between the contacts (e.g. 100 nm×100 nm or smaller) is in the order of 200 nm or smaller. Preferably, the current is capped to within a range of approximately 100 µA. An interesting aspect from capping the current is that the pulse length is in principle a less important parameter. From a numerical calculation, it is evident that the temperature decrease is extremely fast. Likely, this results from the steep drop in resistance between the two spaced-apart contacts.

Figure 5A:
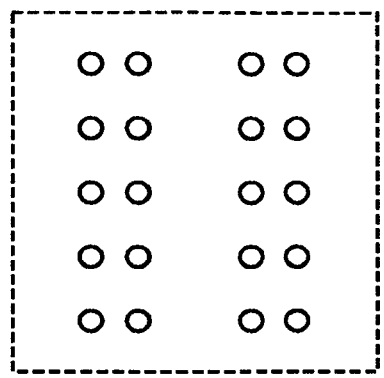
FIG. 5 is a plurality of simplified layout diagrams showing different contact configurations with different contiguous unpatterned layer configurations.
Figure 5B:
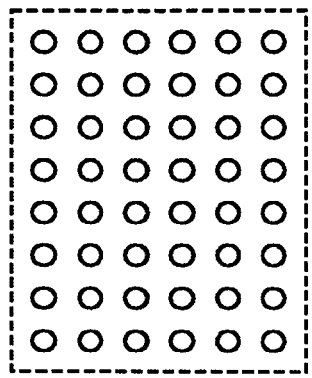
Figure 5C:
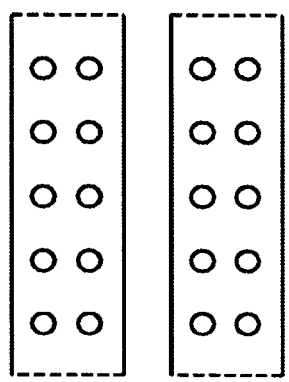
Figure 5D:
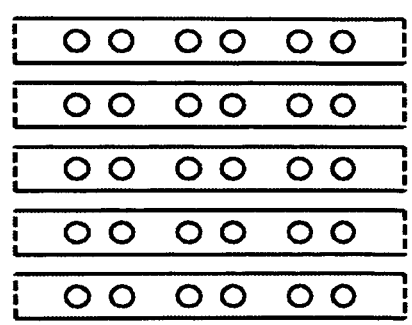

The phase-change layer is in principle unpatterned. For practical reasons, the layer may be patterned into larger blocks. For example, patterning results in blocks each representative of an array or matrix of memory cells each including at least two spaced-apart contacts. A few possible implementations are shown in FIG. 5. Shown in FIG. 5(a) is a completely unpatterned phase change layer with contacts arranged in pairs. In (b) the completely unpatterned layer is shown with contacts in a regularly spaced rectangular array. In (c) the phase change layer is patterned into two sections, each with contacts arranged in pairs therein. In (d) the phase change material is patterned into rows with several pairs of contacts within each row. Many similar structures can be envisaged within the scope of the present invention. Of course, partially unpatterned layers are also supported with the present invention. In an embodiment, a portion of the phase change layer is unpatterned and supports more than a single bit stored therein. As such, unpatterned as used herein is alternatively stated as "bitwise-unpatterned."

Figure 6:
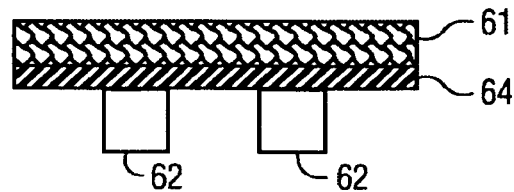
FIG. 6 is a simplified cross sectional side view of another embodiment wherein a contiguous unpatterned phase-change layer is disposed on a low-resistive layer.

Referring to FIG. 6, another embodiment is shown wherein a contiguous unpatterned phase-change layer 61 is combined with a low-resistive layer 64, in the form of an adhesion promoting layer. Alternatively, the low-resistive layer 64 is in the form of a particular seed layer or diffusion barrier. A combination of layers is disposed on a plurality of contacts where any pair of contacts serves as connection nodes for driving current and/or voltage through the contiguous unpatterned phase change layer 61. As a result of the local heating created in the specific path caused by the current in the stack, initially predominantly in the low-resistive layer, the temperature in the phase-change material increases such that more current gradually flows within the phase-change layer 61. Again, a lower-resistive path is thus created between the two nodes. In comparison with the embodiment of FIG. 2, the present embodiment is capable of being driven in constant current mode, with current levels in the mA range. The maximum achievable temperature mainly depends on the current level used during write ($P=R.I2$). Write times are fast with a lower required voltage in comparison with the first embodiment, so that heat dissipation over a larger volume is limited. Ideally, the pulse length is therefore limited to a few nanoseconds. Ultimately, the result is a change in resistance of e.g. 50% only, up to an effective factor 2 to 3, when resistivities and layer thickness are appropriately chosen.

Figure 7:
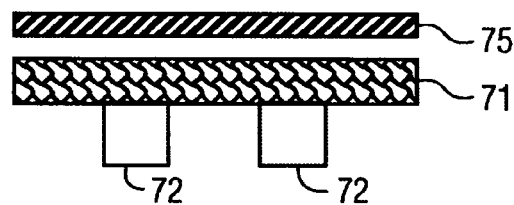
FIG. 7 is a simplified cross sectional side view of an embodiment wherein indirect heating in the phase-change layer is generalised for a system of two galvanically isolated layers.

Referring to FIG. 7, a further embodiment is shown. Here, the idea of indirect heating in the phase-change layer is generalised for a system of two galvanically isolated layers, a phase change layer 71 and another layer 75. The spaced apart electrodes 71 are also shown. A new degree of freedom arises when extra heat is pumped into the phase-change system by applying a constant current powered heat source in the vicinity of the phase-change layer that is under constant voltage with limited current compliance. The heat source is preferably designed in such a way that several resistive elements are writable simultaneously. For instance, in an array concept with orthogonal cell layout, a combination of two heat sources is used to 'switch' particular cells. In an alternative approach, the whole IC is raised to a higher temperature when the data is written into the phase-change cells.

Figure 8:
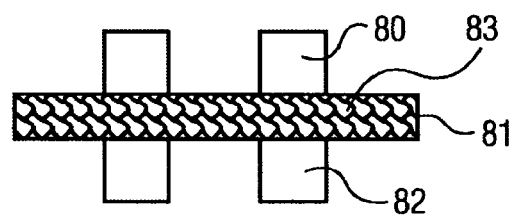
FIG. 8 is a simplified cross sectional side view of an embodiment wherein the pairs of contacts are disposed on opposing sides of the contiguous unpatterned phase change layer.

Referring to FIG. 8, an embodiment is shown wherein the pairs of contacts 82 are disposed on opposing sides of the contiguous unpatterned phase change layer 81. For example, fuse memory cells are formed this way when desired. Upon excitation, using the previously described methods, a low-resistive path 83 forms locally in the phase-change layer 81. This low-resistive path 83 electrically connects the pair of driving contacts. As long as the distance between neighboring cells is in the order of, preferably larger than, the film thickness, interference between cells is limited. Of course one of skill in the art will easily determine contact spacing for providing sufficient isolation between adjacent cells. The advantage of such a fuse memory is its intrinsic scalability, being limited mostly on the film thickness.

Figure 9A:
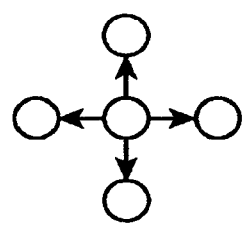
FIG. 9 is a simplified layout diagram showing a configuration for the contacts wherein a single first contact within a pair of contacts also acts as a first contact within another pair of spaced apart contacts.
Figure 9B:
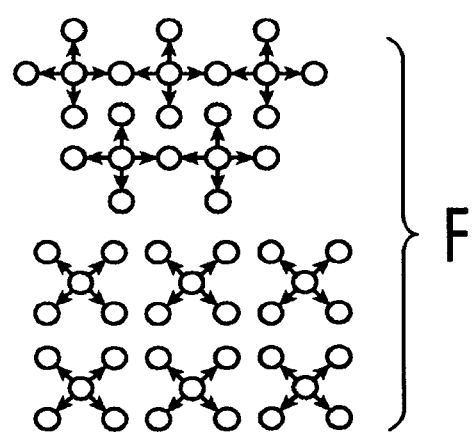

Referring to FIG. 9, an embodiment is shown wherein arrays are rearranged for different memory organisations. For example, a single 'source' contact is combined with a plurality of 'sink' contacts in the case of current or voltage drive. Thus, the contacts, though utilised in pairs, are arranged such that at least one contact within a pair is also a contact within another different pair of contacts. In FIG. 9, a cross-type of macro-cell approach is shown where a centre contact in the form of a via acts as the source contact for switchably forming a current path with each of four sink contacts. The cross-type macro-cells are combinable in a variety of array concepts.

Other ways to realize multi-level memory cells can be envisaged, however each is not as easily implemented. Whereas information is provided in the location of the low-resistive bridge by using different possible directions in the exemplary embodiment, information can also be provided in the form of (1) width of the bridge between two contacts, or (2) length of an at least partially formed bridge between two contacts.

Figure 10:
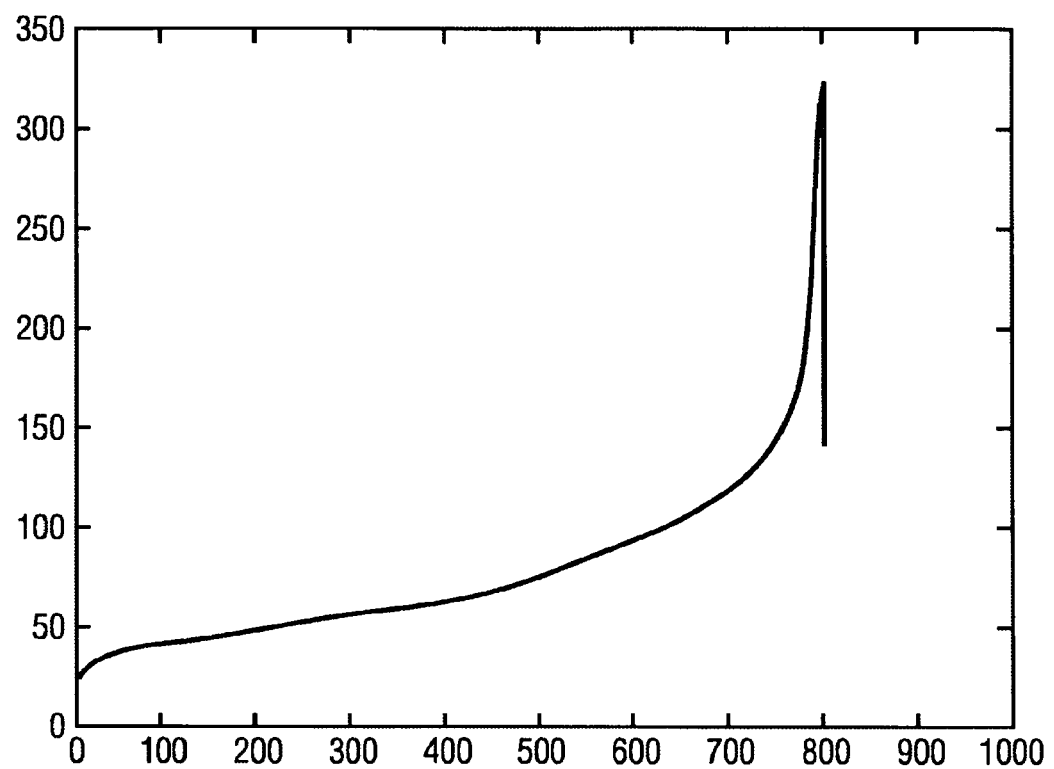
FIG. 10 is a graphical representation of the temperature characteristics of a model as a function of time.
Figure 11:
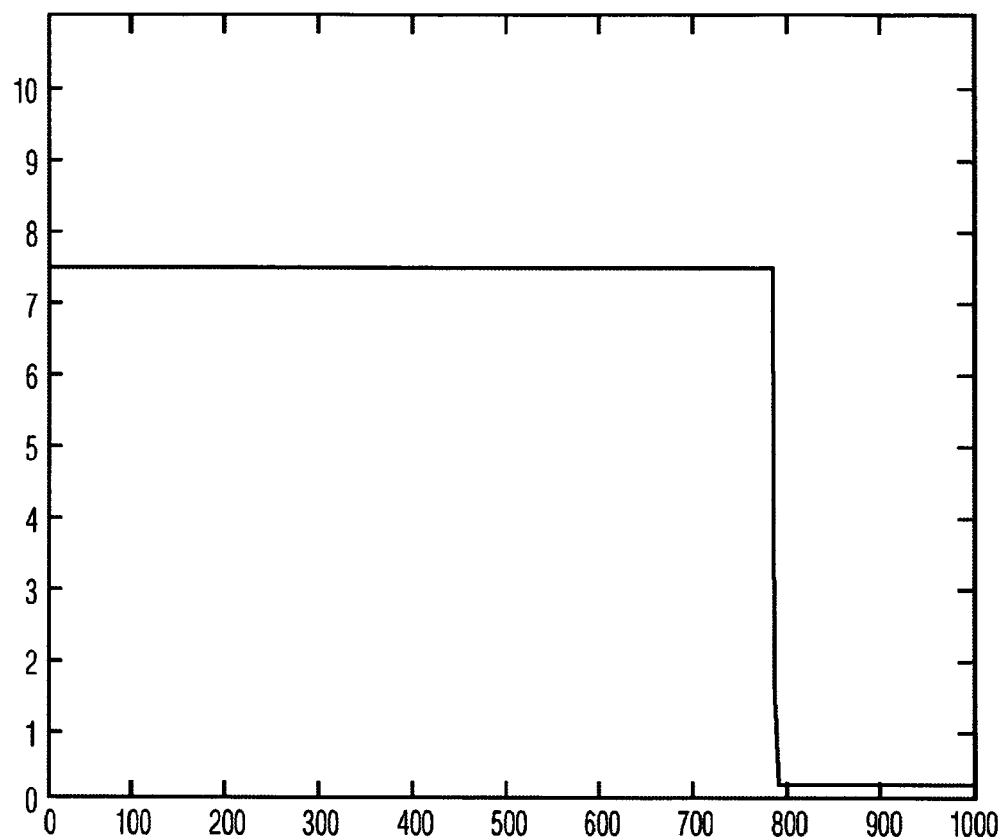
FIG. 11 is a graphical representation of the input/output characteristics of the model as a function of time.

Referring to FIG. 10, the temperature of the model as a function of time are shown. Referring to FIG. 11, the input/output characteristics of the model as a function of time are shown. Initially, the voltage is at maximum, i.e. 7.5 Volts, until around 7.5 ns the low-resistive path is irreversibly created resulting in a sudden drop of total resistance.

Figure 12:
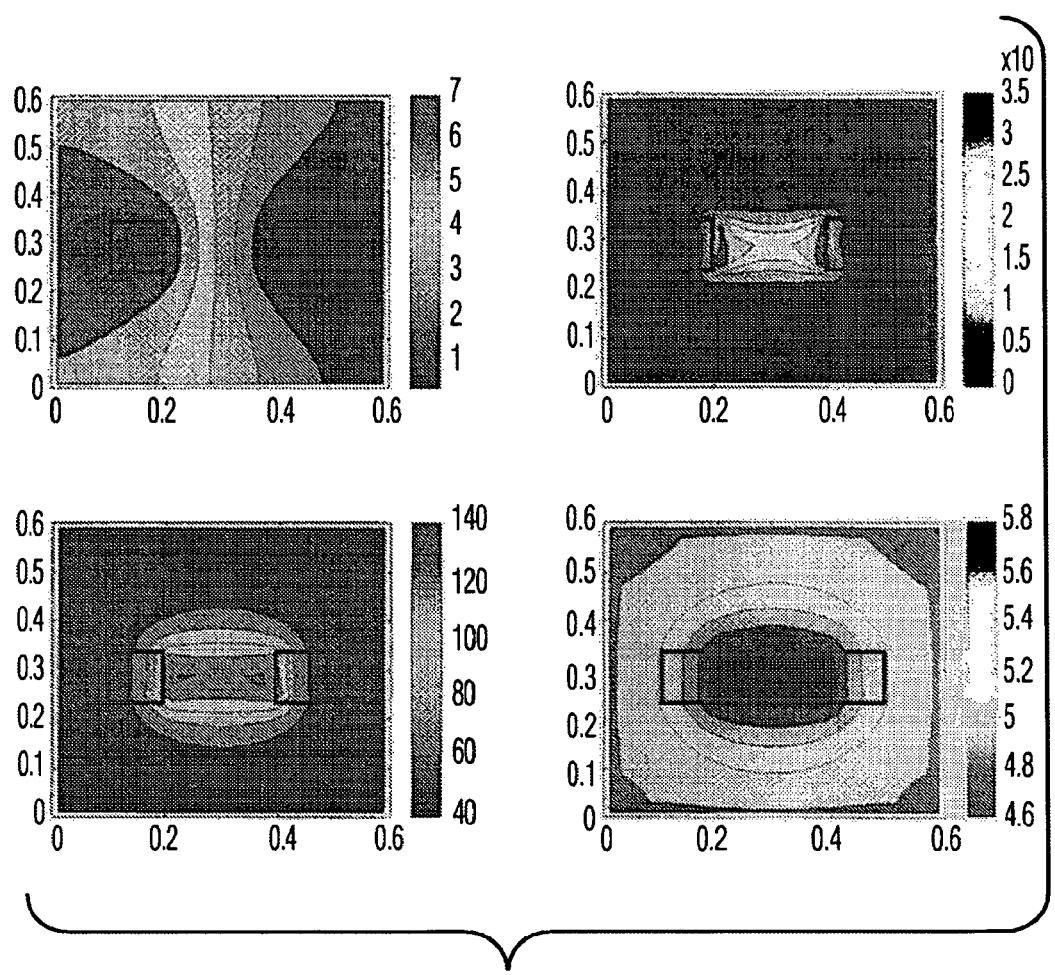
FIG. 12 is a topographic diagram showing voltage in the different nodes, power dissipated locally within the structure, local temperature, and local resistance.
Figure 13:
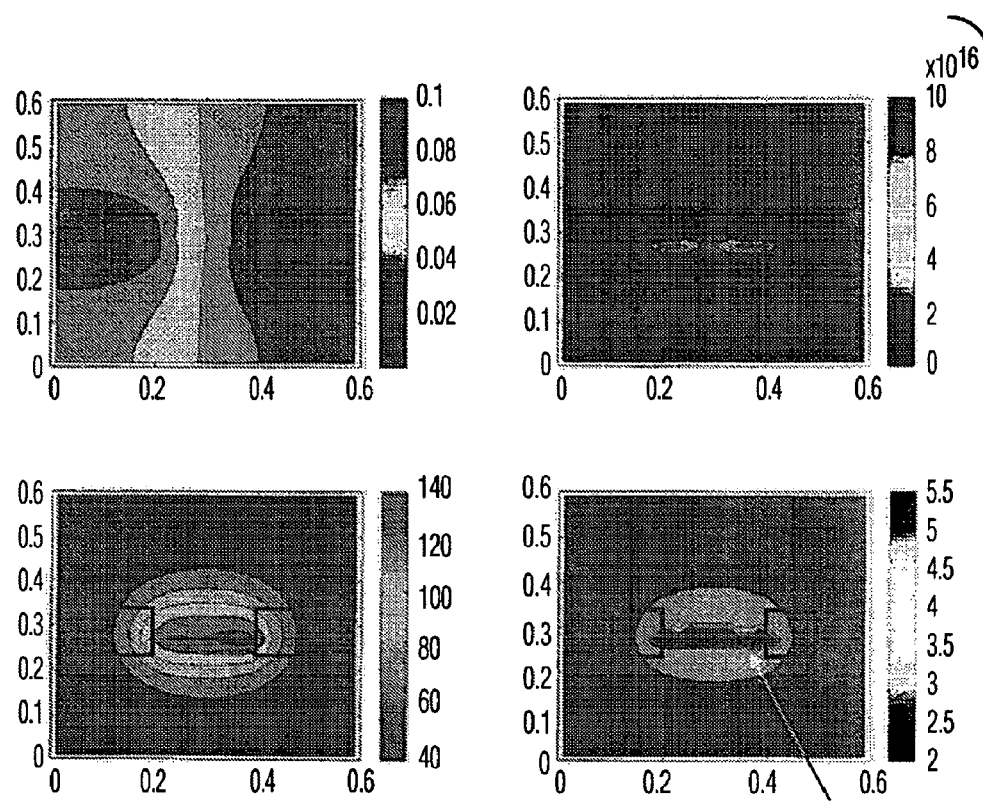
FIG. 13 is a topographic diagram showing voltage in the different nodes, power dissipated locally within the structure, local temperature, and local resistance; and, FIG. 14 is a graphical representation of temperature distribution in and around the phase-change layer immediately after the creation of a low-resistive bridge.

In FIGS. 12 and 13 is shown (left top) the voltage in the different nodes, (right top) the power dissipated locally in the structure, (left bottom) the local temperature, and (right bottom) the local resistance when looking into the layer, just before and after, respectively, creation of a low-resistive bridge between the contacts. In this case, the timeframes of 7.5 and 8.0 ns are viewed. The local resistance view resembles the different resistances connecting to the node that are seen in parallel. A decrease in local resistance therefore reflects local variation in the resistance in the phase-change layer.

Figure 14:
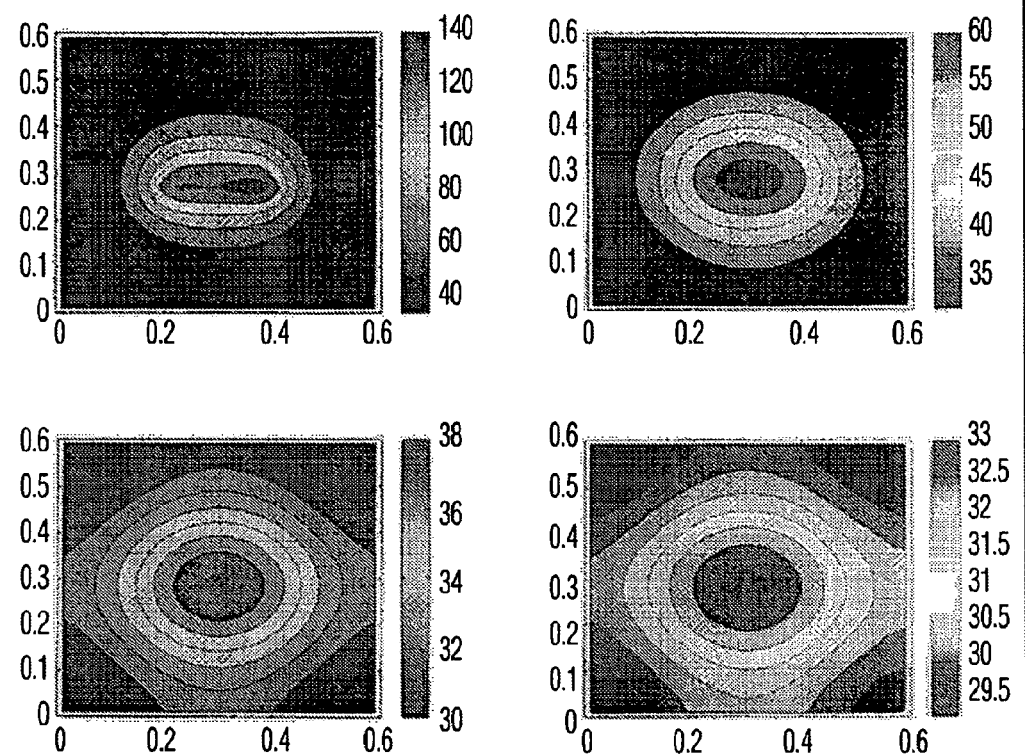

Referring to FIG. 14, a graphical representation of temperature distribution in and around the phase-change layer immediately after the creation of a low-resistive bridge is shown. The highest temperature in the system (i.e. in the phase-change layer) is shown as a function of time in FIG. 10. Initially the temperature only increases gently, that is taking place gradually, in combination with a narrowing of the current channel between the contacts due to the local reduction of resistance. After approximately 7.5 ns a very rapid increase in temperature is observed, locally during the creation of the low-resistive bridge, after which the current compliance is activated. The rapid increase is therefore followed by an equally fast decrease in maximum temperature, due to heat diffusion. In this case, the low-resistive bridge is not formed symmetrically with respect to the contacts. This can be improved by the use of shaped contacts. The contacts are e.g. triangularly tapered to be better localize the Joule heating.

In a preferred embodiment, the contiguous phase change layer is in an amorphous state until data is stored therein. The thermal budget of the back-end of conventional CMOS processing results in a phase change layer in a crystalline state. Due to high temperatures, the initially amorphous layer after deposition is transformed into the crystalline state. In order to avoid this, the temperature budget of the CMOS process after deposition of the phase change layer is optionally limited to prevent crystallization. Alternatively, other phase change materials with a higher crystallization temperature are used. This increases the power consumption for writing information, however it simplifies the integration. For a one time programmable read only memory (OTP-ROM) device, the increased power consumption during writing is not overly significant.

It is therefore anticipated that the phase-change layer is in its amorphous state when programming takes place, i.e. at the end of the IC back-end process, or even to be remained during packaging and PCB mounting. Hence the chip can be programmed electrically at various moments in a production process. The programming action is in principle limited to 'one-time'. Alternatively, the phase change layer is reset into the amorphous state, to restart the complete programming cycle.

Numerous other embodiments may be envisaged without departing from the spirit or scope of the invention. As an example, shape of contacts is somewhat arbitrarily shown. Further, a variety of contact materials are suitable.

What is claimed is:

1. A method of forming an electrically programmable memory device having a non-volatile memory, the method comprising:

providing an amorphous phase change layer; and, providing electrical contacts spaced apart one from another,
wherein a contiguous layer of phase change material is provided having therein a first region for encoding of first data therein and a second other region for encoding of second different data therein;
disposing a first pair of contacts for providing an electrical programming current therebetween, the electrical current for passing through the contiguous layer of phase change material for inducing heating thereof within the first region; and,
disposing a second pair of contacts for providing an electrical programming current therebetween, the electrical current for passing through the contiguous layer of phase change material for inducing heating thereof within the second other region thereof, and
disposing both contacts of the first pair of contacts on a same side of the contiguous layer of phase change material, and
wherein a pair of the electrical contacts for, when conducting, resulting in localized heating within the amorphous phase change layer to result in a region of crystalline phase change layer material within the amorphous phase change layer and electrical conduction between the pair of the electrical contacts.

2. A method according to claim 1 comprising: providing an electrical current between a first contact of the pair of the electrical contacts and a second contact of the pair of the electrical contacts, the current for resulting in localized heating of the amorphous phase change layer; and, upon sufficient heating within the amorphous phase change layer, discontinuing the provided current to allow for cooling of the heated portion of the amorphous phase change layer.

3. A method according to claim 2 wherein sufficient heating is determined based on an elapsed time.

4. A method according to claim 3 wherein the elapsed time is relative to a time for the heated portion of the amorphous phase change layer to crystallize.

5. A method according to claim 3 wherein current is automatically limited once the phase change material is changed to the crystalline state.

6. A method according to claim 2 comprising: reading data from the phase change layer.

7. A method according to claim 1 comprising: providing a one-time programmable read only memory comprising the contacts and the amorphous phase change layer.

* * * * *